United States Patent [19]

Brown

[11] Patent Number: 5,734,299

[45] Date of Patent: Mar. 31, 1998

[54] MICROWAVE VCO HAVING REDUCED SUPPLY VOLTAGE

[76] Inventor: Anthony Kevin Dale Brown, 26 Equestrian Drive, Kanata, Ontario, Canada, K2M 1C1

[21] Appl. No.: 687,304

[22] Filed: Jul. 25, 1996

[51] Int. Cl.$^6$ .................. H03F 3/45; H03B 5/02
[52] U.S. Cl. .................. 330/254; 330/305; 331/108 B
[58] Field of Search .................. 330/252, 254, 330/259, 295, 305; 331/57, 108 B

[56] References Cited

U.S. PATENT DOCUMENTS

| | | |
|---|---|---|
| 4,804,904 | 2/1989 | Katakura .................. 330/252 X |
| 5,172,076 | 12/1992 | Brown .................. 331/57 |
| 5,185,581 | 2/1993 | Brown .................. 330/254 |
| 5,371,475 | 12/1994 | Brown .................. 330/254 |
| 5,420,538 | 5/1995 | Brown .................. 330/252 |
| 5,463,349 | 10/1995 | Petersen et al. .................. 330/254 |
| 5,465,072 | 11/1995 | Atarodi .................. 330/254 |
| 5,483,195 | 1/1996 | Brown .................. 330/254 |

Primary Examiner—Steven J. Mottola
Attorney, Agent, or Firm—George MacGregor; Angela C. de Wilton

[57] ABSTRACT

A transconductance amplifier for use in a low noise, microwave voltage controlled oscillator. The transconductance amplifier incorporates a linear amplifier having ratioed transistors to provide linearized gain. A tuning arrangement combines in-phase and out of phase currents in an inverse ratio to provide a constant D.C. current sum. The tuning circuit has been arranged to operate without a cascode stage such that the power supply voltage requirement is reduced from 5.0 volts to 3.3 volts.

15 Claims, 5 Drawing Sheets

FIG. 1
PRIOR ART

PORT (1)  GAIN→  PORT (2)

FIG. 2
PRIOR ART

PORT (1)  PORT (2)

MICROWAVE VCO HAVING REDUCED SUPPLY VOLTAGE

RELATED PATENTS

This application is related to Applicant's U.S. Pat. Nos. 5,483,195 issued Jan. 9, 1996; 5,420,538 issued May 30, 1995; 5,371,475 issued Dec. 6, 1994; 5,185,581 issued Feb. 9, 1993; and 5,172,076 issued Dec. 15, 1992, the contents of which are incorporated herein by reference.

FIELD OF THE INVENTION

This invention relates to linear amplifiers incorporated into variable delay, low noise, high frequency voltage controlled oscillators and particularly such oscillators having reduced power supply requirements.

BACKGROUND

With the advent of cellular radio telephone distribution systems and the growing information era, the importance of VHF and UHF personal communication systems has grown. Implicit in this is the requirement for low cost integrated solutions for clock recovery and analog UHF signal processing. A major subcomponent of such communication systems is the voltage controlled oscillator (VCO) which must operate at UHF frequencies, at very low noise (jitter). Currently, integrated solutions for the UHF oscillator are sought for cost reasons.

PRIOR ART

In Applicant's prior U.S. Pat. Nos. 5,172,067 and 5,185,581, small signal, voltage controlled oscillators constructed with differential amplifiers are disclosed. These VCO's, which are capable of operation to 1 GHz, can generate up to about 0.15V peak to peak while providing a measured noise jitter which is typically about 5 ps rms, or 0.005 Unit Intervals (UI). A UI is the rms jitter divided by the oscillator period. For many applications a jitter of approximately 0.01 UI is adequate but for future analog/digital converter techniques, jitter of 0.001UI at 1 GHz or better will be required. This represents a required improvement of 14 dB over that which is achieved by the aforementioned prior patents. The present invention relates to a VCO which addresses this requirement, while having lower power supply requirements than Applicant's prior system as described in U.S. Pat. No. 5,483,195.

SUMMARY OF THE INVENTION

It is an object of the present invention to provide a linear amplifier which generates low noise at microwave frequencies.

It is a further object of the invention to provide a low noise, voltage controlled oscillator from a pair of interconnected linear amplifiers.

It is yet a further object of the invention to provide a voltage controlled oscillator having a high degree of linearity at high signal levels.

It is a still further object of the invention to provide the aforementioned advantages with a low power supply voltage (3.3V).

In accordance with a first aspect of the present invention there is provided a transconductance amplifier having a variable delay. The amplifier comprises a linear amplifier having three bipolar differential pairs, each having a constant current source and a gain linearizing offset provided by ratioed input emitter followers and associated current mirrors. The differential pairs provide a differential output. The transconductance amplifier also has an auxiliary amplifier in parallel with the linear amplifier, the auxiliary amplifier having first, second and third differential pairs, each having a constant current source. The auxiliary amplifier provides a differential tuning current. A tuning control circuit receives the differential tuning current and provides a tuning output.

In a preferred embodiment each current source for the differential pairs in the linear amplifier provides a greater current than the current sources for differential pairs in the auxiliary amplifier. The ratio of the two currents determines the portion of the output current which goes to the tuning circuit and hence controls the tuning range.

In accordance with a second aspect of the present invention there is provided a transconductance amplifier having a third linear amplifier in parallel with the first linear amplifier and the auxiliary amplifier. Additionally, the tuning circuit comprises four differential pairs wherein differential tuning current from the auxiliary amplifier is provided to two of the tuning differential pairs and the current from the third linear amplifier is provided to the other two tuning differential pairs. The four differential pairs each with ratioed emitters combine to form a linear tuning arrangement.

In a preferred embodiment the feedback current is summed with the main current in a tapped load resistance.

In accordance with a further aspect of the invention there is provided a voltage controlled oscillator having a pair of transconductance amplifiers interconnected such that the positive and negative outputs of the first amplifier are connected to the positive and negative inputs respectively of the second amplifier while the negative output of the second amplifier is connected to the positive input of the first amplifier and the positive output of the second amplifier is connected to the negative input of the first amplifier. A 90° phase shift exists between the outputs of each amplifier.

BRIEF DESCRIPTION OF THE DRAWINGS

The invention will now be described in greater detail with reference to the attached drawings wherein.

DETAILED DESCRIPTION OF THE INVENTION

In U.S. Pat. No. 5,483,195 a VCO was described which operates on the principle of a gyrator, having these properties:

1. the gyrator consists of two transconductance amplifiers connected in a loop with a wired 180 degree phase reversal at D.C.

2. the gyrator loop gain is controlled to be slightly greater than unity at the gyrator resonant frequency: This control is provided by an automatic gain control system (AGC), so as to maintain an oscillation at the gyrator resonant frequency.

3. the gyrator has linear transconductors of the design described in U.S. Pat. No. 5,420,538 whose linearity enables the creation of large resonator Q factors at large signal levels, resulting in low phase noise. Further, the linear transconductors have variable transconductance for the purpose of automatic gain control, which control is obtained by variation of the amplifier bias voltage.

4. the gyrator has a tuning mechanism which utilizes a current feedback component of the output of each of two transconductance amplifiers whose magnitude and phase are controlled to provide a variable delay through the gyrator amplifiers by means of vector summation of the feedback currents with the output currents of the associated amplifier. One form of the transconductance amplifier is illustrated in prior art FIG. 4.

These objectives having been met, the properties of the gyrator are described by Equation 1 and Equation 2 below. Here Equation 1 describes the resonant angular frequency $\overline{\omega}_0$ in terms of the amplifier transconductance $g_m$, the gyrator capacitance C and a small second order term which is the product of the gyrator loss admittance G and the amplifier built-in-delay D. Equation 2 describes an orthogonal condition which controls the resonator Q factor such that the Q is infinite when this condition is satisfied. In practice the delay D must be slightly greater than the unity gain value to ensure oscillation.

$$\overline{\omega}_0 = g_m/(C+GD) \quad \text{(EQ 1)}$$

$$D = G/(\overline{\omega}_0^2 C) \quad \text{(EQ 2)}$$

All these, and other features are described in the aforementioned U.S. Pat. No. 5,483,195, to provide a low phase noise voltage controlled oscillator having a quadrature phase sinusoidal output with very low harmonic distortion.

Experimental data shows that at frequencies of 2.4 GHz, a total harmonic distortion of −50 dBc and better can be maintained.

The present invention provides for all the foregoing objectives to be obtained by modified transconductance amplifiers requiring lower power supply voltages than in U.S. Pat. No. 5,483,195 and consequently to provide for reduced power consumption. This is accomplished by the amplifier circuit illustrated in FIG. 5.

Figure 1:
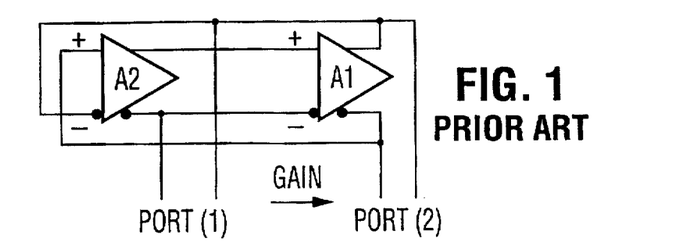
FIG. 1 is a block diagram of a prior art two-stage ring oscillator.
Figure 2:
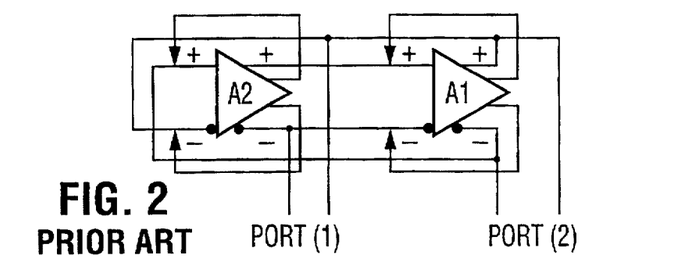
FIG. 2 is a block diagram of an oscillator including a tuning arrangement.
Figure 3:
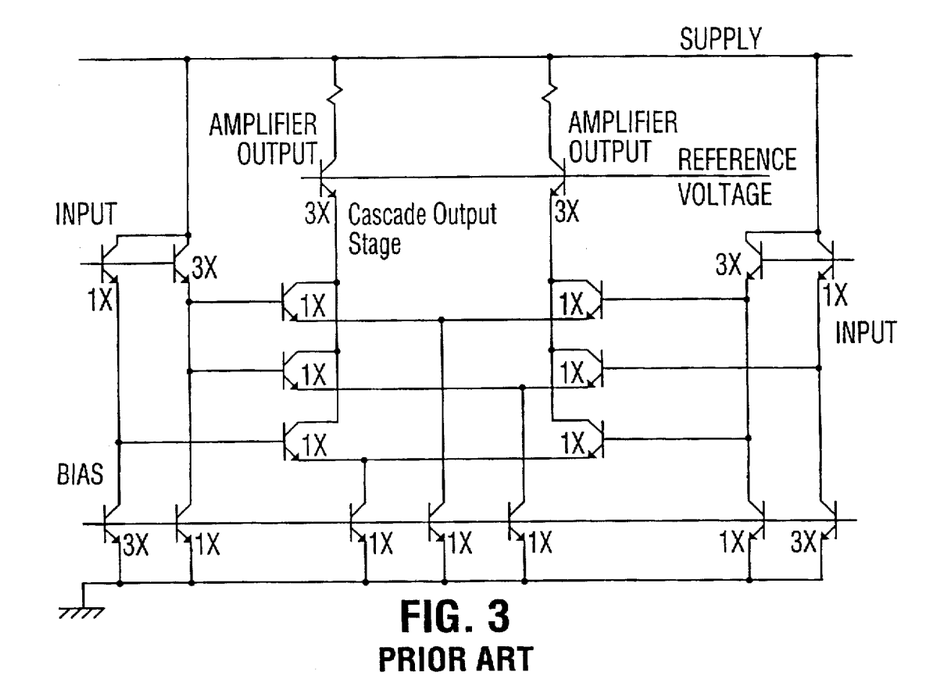
FIG. 3 is a circuit diagram of a linear amplifier according to the prior art.
Figure 4:
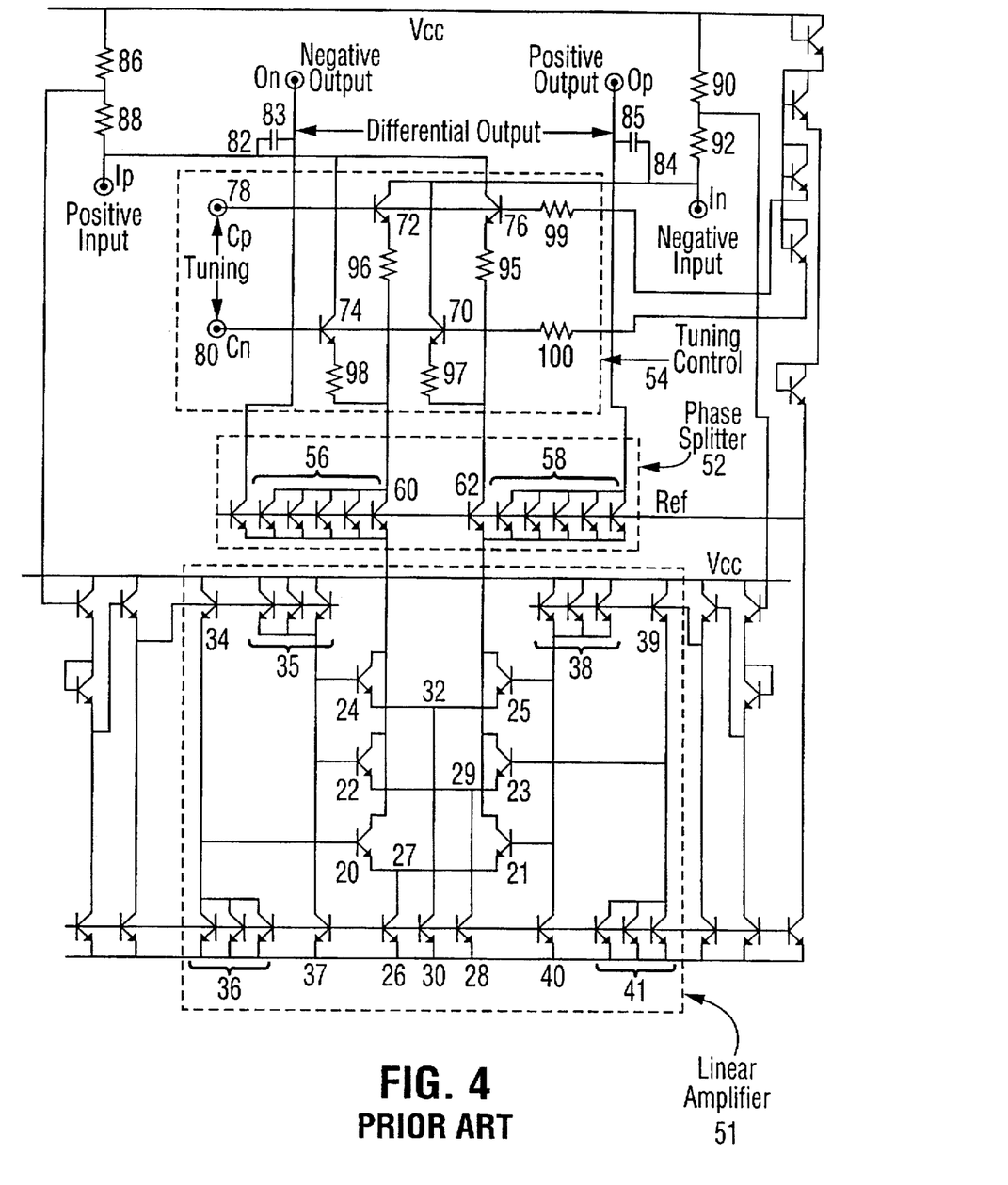
FIG. 4 is the amplifier of FIG. 3 with a tuning circuit according to the prior art.
Figure 5:
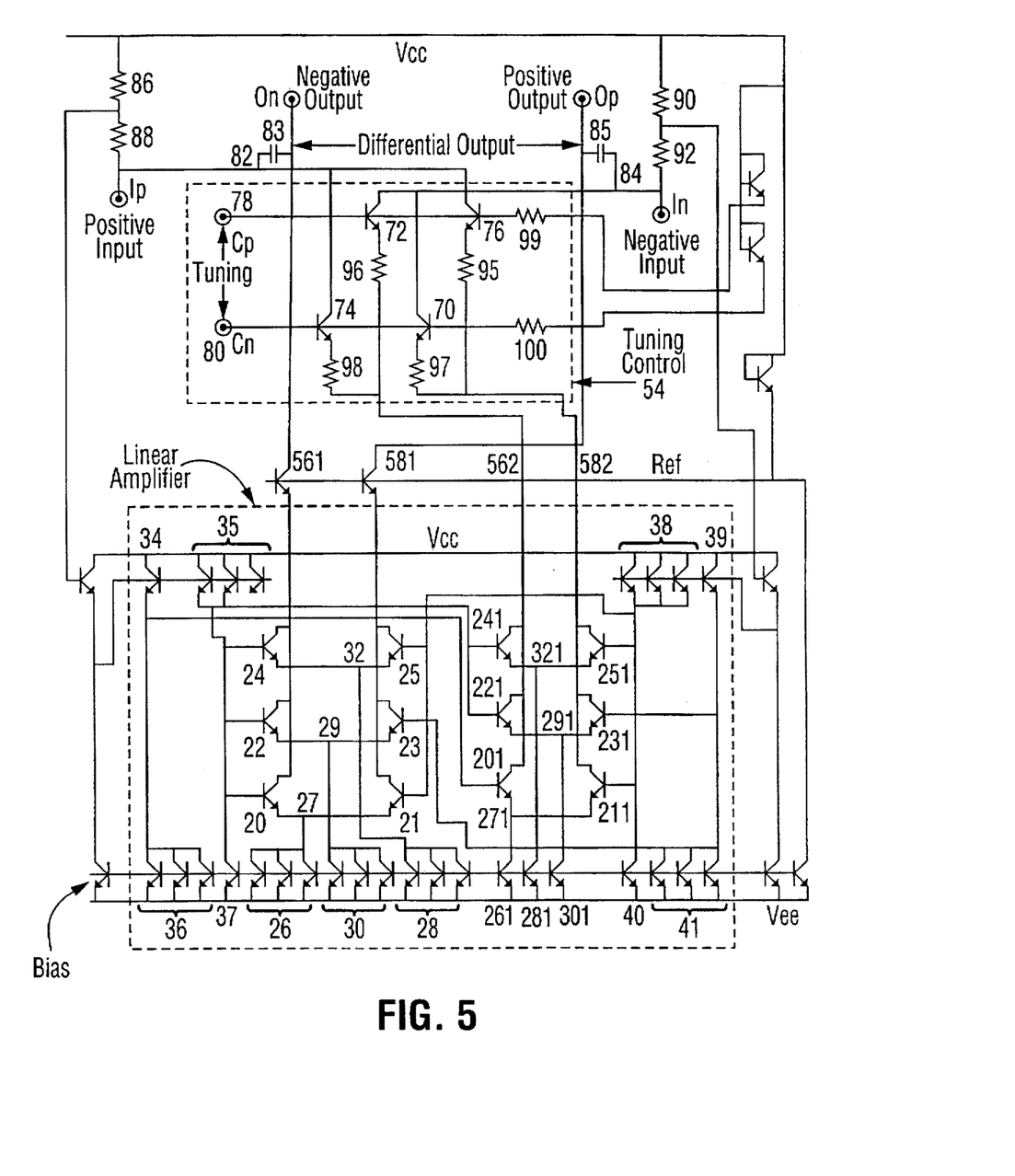
FIG. 5 is a detailed circuit diagram of the 3.3 volt supply linear tunable gyrator transconductance amplifier of the present invention.

Specifically, FIG. 1, taken from U.S. Pat. Nos. 5,371,475, 5,172,076 and 5,185,581, illustrates a gyrator comprised of two transconductance amplifiers with wired 180 degree phase reversal at D.C. FIG. 2, taken from U.S. Pat. No. 5,483,195, illustrates a gyrator with feedback current mechanism for tuning the gyrator resonant frequency. FIG. 3, taken from U.S. Pat. No. 5,420,558, illustrates a linear microwave transconductance amplifier comprised of three differential pairs with small offset voltages arranged at their inputs to create a linear characteristic and a cascode output stage to enable wideband microwave performance. FIG. 4 illustrates a linear transconductance amplifier suitable for operation at supply voltage of 5 volts or greater according to U.S. Pat. No. 5,483,195. FIG. 5 illustrates the new circuit of the linear transconductance amplifier which is suitable for operation at a supply voltage of 3.3 volts.

According to U.S. Pat. No. 5,483,195, the circuit of FIG. 4 comprises three principal elements which are illustrated by the dotted-line boxes. These principal elements are a linear amplifier, a cascode phase splitter and a tuning arrangement. The purpose of the cascode phase splitter is two-fold: It provides the necessary cascode stage for the linear amplifier in order to maximize the bandwidth according to U.S. Pat. No. 5,420,538: It also provides a precise ratioed current division of the linear amplifier output, the smaller part of which is required by the tuning arrangement. A disadvantage of the circuit as illustrated in FIG. 4 is that the tuning arrangement and the cascode phase splitter appear in series cascode, thus requiring a minimum 5 Volt supply.

According to the objectives of the present invention, a reduction of the supply voltage is achieved by eliminating the series cascode phase splitter of the amplifier of FIG. 4. This is achieved by augmenting the linear amplifier with a built-in precisely ratioed phase splitter and is illustrated in FIG. 5. All the tuning arrangements described in U.S. Pat. No. 5,483,195 are possible with this new arrangement, one of which is illustrated in FIG. 5 and corresponds to the similar arrangement of FIG. 4. Thus in this discussion, no further reference to the tuning arrangement is necessary. The linear amplifier of FIG. 5 provides a main output through cascode transistors 561 and 581 and an auxiliary ratioed, lower, output directly to the tuning arrangement. Thus there is no series cascode amplifier between the auxiliary output and the tuning arrangement. This arrangement is possible without degrading the performance of the amplifier since the tuning arrangement also performs the function of a cascode output stage.

The linear amplifier of FIG. 5 is similar to that of FIG. 4 in that the two arrangements have identical input circuits which provide the necessary offset voltages required for linearity: This is provided by transistors 34,35,36,37,38,39, 40 and 41 using the same nomenclature in both figures. As described in U.S. Pat. No. 5,420,538, the required offset voltages are obtained by the ratios of the transistors 35:34, 36:37, 38:39, 41:40 which, according to the prior art, is specified as 3:1 for optimum linearity. It was particularly specified in U.S. Pat. No. 5,420,538 that this ratio is required to be an integer value due to the lithographic restriction associated with minute microwave transistors.

With reference to FIG. 4, the linear amplifier output comprises three differential pairs whose outputs are connected in parallel, namely, transistor pairs (20,21), (22,23) and (24,25). Associated with these differential pairs are current sinks 26,30 and 28 respectively. These transistor differential pairs also appear in the new arrangement of FIG. 5, with the same nomenclature: However the associated three current sinks now each consist of three transistors in parallel, again with the same nomenclature 26,30 and 28. In addition in FIG. 5, another auxiliary amplifier output stage is added, comprising differential transistor pairs (201,211), (221,231) and (241,251) and these have associated single transistor current sinks 261, 301 and 281. In a typical embodiment it can be specified that three times as much current flows through the main amplifier output compared to the auxiliary amplifier output due to the size of current sinks 26,30 and 28. Thus the ratio of the current mirror sizes which serve the main and auxiliary amplifiers determines the proportion of the amplifier output current which is fed to the tuning arrangement, and hence according to U.S. Pat. No. 5,483,195, this precisely controls the tuning range. This ratio may be adjusted according to the particular tuning range required. Two additional features of this arrangement are to be noted, being properties of the variable transconductance amplifier of U.S. Pat. No. 5,420,538: the linearity of the main and auxiliary outputs is not dependent upon the ratio of the above current sinks: also the main to auxiliary output current ratio remains constant as the AGC adjust the bias voltage of the amplifier.

With reference to FIG. 5, the illustrated gyrator linear transconductance amplifier with tuning control has a reference voltage which is derived by means of a single diode drop (approximately 0.85 volts at 27° C.) from the positive power supply. The voltage at the emitters of the cascode amplifier transistors 561 and 581 are thus two diode drops from the positive power supply. Since the collectors of the linear amplifier are thus held substantially constant, the emitters of the differential pairs may be biased at approximately three diode drops from the positive power supply. This means that, with a standard 3.3 volts power supply, the current sinks of the linear amplifier output stages are biased at a collector emitter voltage of slightly less than one diode drop. This is sufficient for their operation as current sinks under the control of the AGC. In addition, in a particular embodiment of this invention, these current sinks may be augmented with a small amount of emitter degeneration, according to standard practice, to improve the matching of these current sinks. Alternatively, in a BiCMOS technology, these current sinks could be implemented as NMOS transistors with degeneration resistors: such NMOS transistors can operate with lower drain voltages than the equivalent bipolar transistors and so permit yet lower supply voltages.

Figure 6:
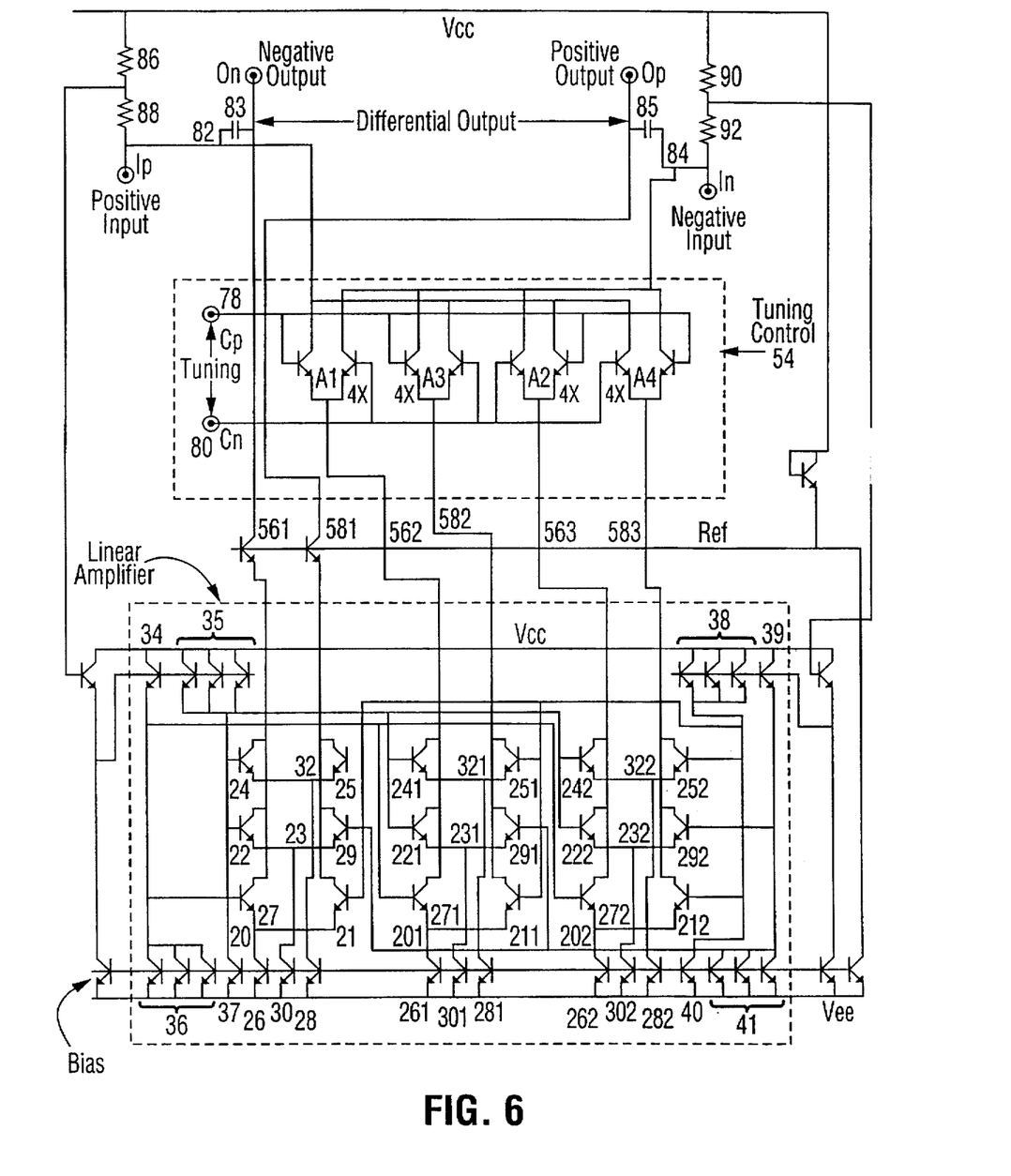
FIG. 6 is a detailed circuit diagram of a second embodiment of the linear amplifier of the present invention.
Figure 7:
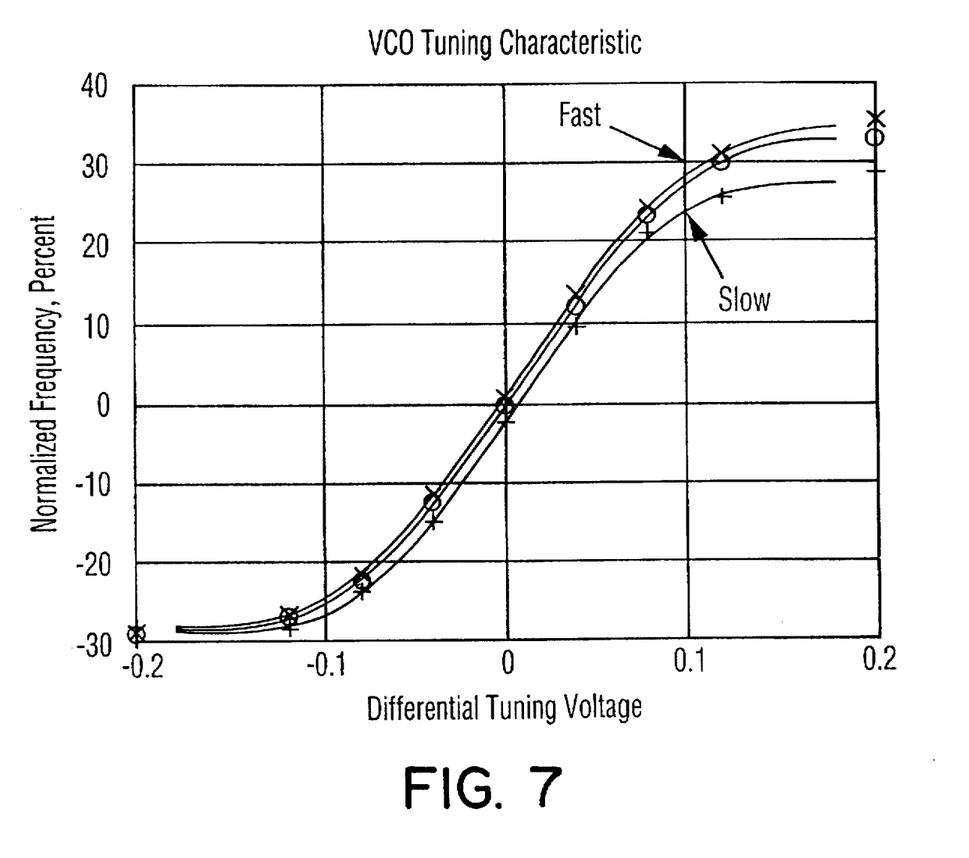
FIG. 7 is a graph of a typical spread of the tuning characteristics of the oscillator.

Yet another alternative version of the tuning arrangement is possible while meeting all of the objectives of the foregoing circuits. As noted in prior art, emitter degeneration resistors are present in the tuning arrangement of FIG. 5 for the purpose of decreasing the noise gain of the tuning transistors of FIG. 5: these resistors however impair the linearity of the translinear tuning arrangement. An alternative arrangement is illustrated in FIG. 6. In this case, an additional linear amplifier consisting of three differential pairs (242,252), (222,232), (202,212) has been added to the tuning arrangement to provide yet an additional pair of output currents on nodes 563,583. The bias currents of these three differential pairs are the same as those of the three differential pairs (241,251), (221,231), (201,211), and are typically of smaller value than the bias currents of the main amplifier differential pairs (24,25), (22,23), (20,21) by a predetermined ratio R. The ratio R determines the maximum frequency range over which the oscillator can be tuned, independent of processing variations and temperature (as before). The additional linear amplifier permits four pairs of differential pairs (A1,A2,A3,A4) each with ratioed transistor emitters of 4:1 to be combined in a linear tuning arrangement. It can be shown that the VCO gain resulting from this arrangement is substantially constant, independent of process variations and temperature. A graph of a typical spread of the tuning characteristics for fast, typical and slow processes is shown in FIG. 7. The frequency shift due to the bipolar transistor variation is less than two percent over the usable tuning range. The mode of operation of this linear tuning arrangement can be understood as follows. U.S. Pat. No. 5,420,538 has described how two differential pairs arranged in parallel input and output connections and with emitter ratios of 1:4 and 4:1 respectively can constitute a linear amplifier for input signal levels below a certain value independent of the value of the equal differential pair tail currents. In FIG. 6, differential pairs (A1,A2) constitute such a linear amplifier: also differential pairs (A3,A4) constitute a second linear amplifier. These two linear amplifiers are arranged in the output circuits of linear amplifiers (241,251), (221,231), (201,211) and (242,252), (222,232), (202,212) so as to form a linear four quadrant mixer. Thus the magnitude of the tuning control inputs linearly controls the magnitude of the quadrature feedback currents, resulting in the linear characteristics of FIG. 7. Finally the noise contribution of differential pairs (A1,A2,A3,A4) is less than that of a simple Gilbert cell without degeneration resistors due to two factors: a 3 dB noise factor improvement results from the parallel combination of the pairs of differential amplifiers: also, the noise power delivered to the VCO load is reduced by about 12 dB due to the reduced gain of the amplifier. Total theoretical improvement is about 15 dB.

According to the objectives of this invention, a new linear transconductor has been achieved which replicates the properties of the transconductor described in U.S. Pat. No. 5,483,195 and 4,420,538, while at the same time requiring substantially less voltage from the power supply for normal operation. This results in a nominal 33 percent power saving, as well as conforming to the accepted 3.3 volt standard power supply voltage.

Additional features of the present invention are identical to those of U.S. Pat. No. 5,483,195, namely the provision of tapped input resistors which also form the load resistors of the other gyrator associated amplifier. As determined by the aforementioned U.S. patents, these tapped load resistors can have different tap ratios for the two amplifiers, so as to provide the gyrator with two port gain. This, according to the prior art, is useful for providing multiple gyrator configurations.

Although specific embodiments of the invention have been illustrated and described it will be apparent to one skilled in the art that variations and alternatives to these embodiments are possible. It is to be understood, however, that such variations and alternatives may be within the scope of the invention as defined by the appended claims.

We claim:

1. A transconductance amplifier having a variable delay, said amplifier comprising:
a first linear amplifier having three bipolar differential pairs, each of said differential pairs having a constant current source;
gain linearizing offset provided by ratioed input emitter followers and associated current mirrors;
differential outputs generated by said differential pairs;
an auxiliary amplifier in parallel with said linear amplifier, said auxiliary amplifier having first, second and third differential pairs, each having a constant current source, said auxiliary amplifier providing a differential tuning current and tuning control means receiving said differential tuning current from said auxiliary amplifier and providing a tuning output.

2. A transconductance amplifier as defined in claim 1, said current source for each linear amplifier differential pairs providing a greater current than said constant current sources for said first, second and third differential pairs in said auxiliary amplifier.

3. A transconductance amplifier as defined in claim 1, the ratio of the current through each linear amplifier differential pair and the current through said differential pairs in said auxiliary amplifier being an integer.

4. A transconductance amplifier as defined in claim 3, said integer being three.

5. A transconductance amplifier as defined in claim 3, the ratio of current flowing through respective differential pairs used to determine the proportion of said differential current flowing to said tuning control.

6. A transconductance amplifier as defined in claim 5, said ratio establishing a tuning range.

7. A transconductance amplifier as defined in claim 1, having a third linear amplifier in parallel with said first linear amplifier and said auxiliary amplifier.

8. A transconductance amplifier as defined in claim 7, said tuning control means comprising first, second, third and fourth tuning differential pairs.

9. A transconductance amplifier as defined in claim 8, tuning current from said auxiliary amplifier being provided to said first and second tuning differential pairs and tuning current from said third linear amplifier being provided to said third and fourth tuning differential pairs.

10. A transconductance amplifier as defined in claim 9, each of said first, second, third and fourth tuning differential pairs having ratioed emitters.

11. A transconductance amplifier as defined in claim 10, said ratioed emitters providing a linear tuning arrangement.

12. A transconductance amplifier as defined in claim 1, having a supply voltage of 3.3 volts.

13. A transconductance amplifier as defined in claim 7, having a supply voltage of 3.3 volts.

14. A voltage controlled oscillator comprising first and second transconductance amplifiers, with a positive output of said first amplifier connected to a positive input of said second amplifier, a negative output of said first amplifier connected to a negative input of said second amplifier, a positive output of said second amplifier connected to a negative input of said first amplifier and a negative output of said second amplifier connected to a positive input of said first amplifier, each of said first and second transconductance amplifiers having a variable delay and comprising:
a first linear amplifier having three bipolar differential pairs, each of said differential pairs having a constant current source;
gain linearizing offset provided by ratioed input emitter followers and associated current mirrors;
differential outputs generated by said differential pairs; and
an auxiliary amplifier in parallel with said linear amplifier, said auxiliary amplifier having first, second and third differential pairs, each having a constant current source, said auxiliary amplifier providing a differential tuning current and tuning control means receiving said differential tuning current from said auxiliary amplifier and providing a tuning output.

15. A voltage controlled oscillator comprising first and second transconductive amplifiers, with a positive output of said first amplifier connected to a positive input of said second amplifier, a negative output of said first amplifier connected to a negative input of said second amplifier, a positive output of said second amplifier connected to a negative input of said first amplifier and a negative output of said second amplifier connected to a positive input of said first amplifier, each of said first and second transconductance amplifiers having a variable delay and comprising:
a first linear amplifier having three bipolar differential pairs, each of said differential pairs having a constant current source;
gain linearizing offset provided by ratioed input emitter followers and associated current mirrors;
differential outputs generated by said differential pairs; and
an auxiliary amplifier in parallel with said linear amplifier, said auxiliary amplifier having first, second and third differential pairs, each having a constant current source, said auxiliary amplifier providing a differential tuning current and tuning control means receiving said differential tuning current from said auxiliary amplifier and providing a tuning output,
the voltage controlled oscillator further comprising a third linear amplifier in parallel with said first linear amplifier and said auxiliary amplifier,
said tuning control means comprising first, second, third and fourth tuning differential pairs, each of said first, second, third and fourth tuning differential pairs having ratioed emitters, tuning current from said auxiliary amplifier being provided to said first and second tuning differential pairs and tuning current from said third linear amplifier being provided to said third and fourth tuning differential pairs.

* * * * *

UNITED STATES PATENT AND TRADEMARK OFFICE
CERTIFICATE OF CORRECTION

PATENT NO. : 5,734,299

DATED : March 31, 1998

INVENTOR(S) : Anthony K.D. Brown

It is certified that error appears in the above-identified patent and that said Letters Patent is hereby corrected as shown below:

On the Title Page:
Insert
Item [73] Assignee: NORTEL NETWORKS CORPORATION, Montreal, Canada Signed and Sealed this Twenty-seventh Day of March, 2001

Attest:

NICHOLAS P. GODICI

Attesting Officer

Acting Director of the United States Patent and Trademark Office